United States Patent [15] 3,646,408

Kastner [45] Feb. 29, 1972

[54] SEMICONDUCTOR WIRELESS VOLTAGE AMPLIFIER MOUNTED ON A DIELECTRIC SUBSTRATE

[72] Inventor: Ledyard Kastner, c/o L-K Engineering Co., 3579 Merrick Road, Seaford, N.Y. 11783

[22] Filed: Jan. 13, 1971

[21] Appl. No.: 106,267

Related U.S. Application Data

[63] Continuation-in-part of Ser. No. 786,628, Dec. 24, 1968, abandoned, and a continuation-in-part of 699,100, Jan. 19, 1968, Pat. No. 3,589,003, and a continuation-in-part of 699,205, Jan. 19, 1968.

[52] U.S. Cl. ....................317/234 R, 317/234 E, 317/234 F, 317/234 G, 317/234 H, 317/234 W, 29/577

[51] Int. Cl. ..........................................H01l 3/00, H01l 5/00

[58] Field of Search ........................317/234, 1, 3, 3.1, 4, 4.1, 317/5, 11; 321/11; 29/580, 577, 583

[56] References Cited

UNITED STATES PATENTS

| | | | |
|---|---|---|---|
| 2,791,731 | 5/1957 | Walker et al. | 317/234 |
| 3,133,336 | 5/1964 | Marinace | 317/234 |
| 3,365,794 | 1/1968 | Botka | 317/234 |
| 3,373,335 | 3/1968 | Rosenberg | 317/234 |
| 3,383,760 | 5/1968 | Shwartzman | 317/234 |
| 3,444,452 | 5/1969 | Janssen | 317/234 |
| 3,454,841 | 7/1969 | Urba et al. | 317/234 |
| 3,463,970 | 8/1969 | Gutzwiller | 317/234 |
| 3,476,985 | 11/1969 | Magner et al. | 317/234 |

*Primary Examiner*—John W. Huckert
*Assistant Examiner*—Andrew J. James
*Attorney*—Bauer & Amer

[57] ABSTRACT

A semiconductor construction comprising an assembly of layered semiconductive material maintained within a nonconductive body without connecting leads and its application as part of an integrated construction of electronic components.

10 Claims, 9 Drawing Figures

INVENTOR.
LEDYARD KASTNER
BY Jerome Lange
ATTORNEY

INVENTOR.
LEDYARD KASTNER

BY Jerome Bauer

ATTORNEY

SEMICONDUCTOR WIRELESS VOLTAGE AMPLIFIER MOUNTED ON A DIELECTRIC SUBSTRATE

CROSS-REFERENCE TO RELATED APPLICATIONS

This application is a continuation-in-part application of my application Ser. No. 786,628 entitled WIRELESS VOLTAGE AMPLIFIER, SEMICONDUCTOR CONSTRUCTION AND METHOD OF FABRICATION filed on Dec. 24, 1968 and now abandoned, and also continues, in part, material originally included in my copending applications, Ser. No. 699,100, now U.S. Pat. No. 3,589,003 entitled VOLTAGE AMPLIFIER, and Ser. No. 699,205, entitled PARALLEL HIGH VOLTAGE CAPACITOR, both filed on Jan. 19, 1968, for which claim is made to all legal and equitable benefits which are derivable therefrom.

BRIEF SUMMARY OF THE INVENTION

The present invention is directed to the construction of miniature semiconductor devices and to its employment in electronic components. In particular, the present invention is directed to a novel diode, without any leads, and its method of manufacture and to a voltage amplifier employing the same.

As will be seen from the aforementioned patent application Ser. No. 699,100, there are occasions and need for multiple ganged or otherwise oriented semiconductors of high-voltage, low-capacity, low-current characteristics. At present, semiconductors, notably diodes, are individually made by a variety of processes. One such, dubbed the "nailhead" process, is representative of the prior art fabrication of high-voltage semiconductors. In this process, a plurality of crystalline wafers, or other passivated conductive material, are stacked upon and welded to a base of silver or other precious material having the shape of a nail and then chemically fused, sealed in varnish, and finally epoxied so as to encase the unit. Such semiconductors are individually manufactured and require an inordinate amount of delicate, precise and time consuming handling to fabricate and employ materials which are themselves expensive. Consequently, highly efficient and reliable units are quite costly.

Furthermore, the cost of using these units in major components is also high, in that, the "nailhead" lead must be soldered or fused to other elements, especially since the "nailhead" is silver or other precious metal.

It was, of course, the intention to employ individual prior art semiconductors in the assembly of the voltage amplifier described in Ser. No. 699,100 and while they still may be so used to full advantage, it would be advantageous to have a simpler, easier handling, and much less costly device to use. It is the object of this invention to provide such a preferred semiconductor.

It is another object of this invention to provide a novel semiconductor construction and method of fabrication.

It is still another object of this invention to provide an integrated method for the joint fabrication of semiconductor elements and the assembly within larger components.

It is a specific object of the present invention to provide a high-voltage, low-current, voltage amplifier employing a leadless semiconductor assembly and the method for making the same.

These and other objectives and advantages will be apparent from the following description of the preferred form of the invention. The description makes reference to the accompanying drawings in which.

FIGS. 1 to 4 show a representative form of multiple semiconductor construction and from it various other forms will readily become apparent. All the inventive features relating both to the structure and method of fabrication of these novel devices will also be apparent from these Figures. The drawings and the following explanation should be taken as illustrative only and not restrictive in any sense.

Figures 1, 2:
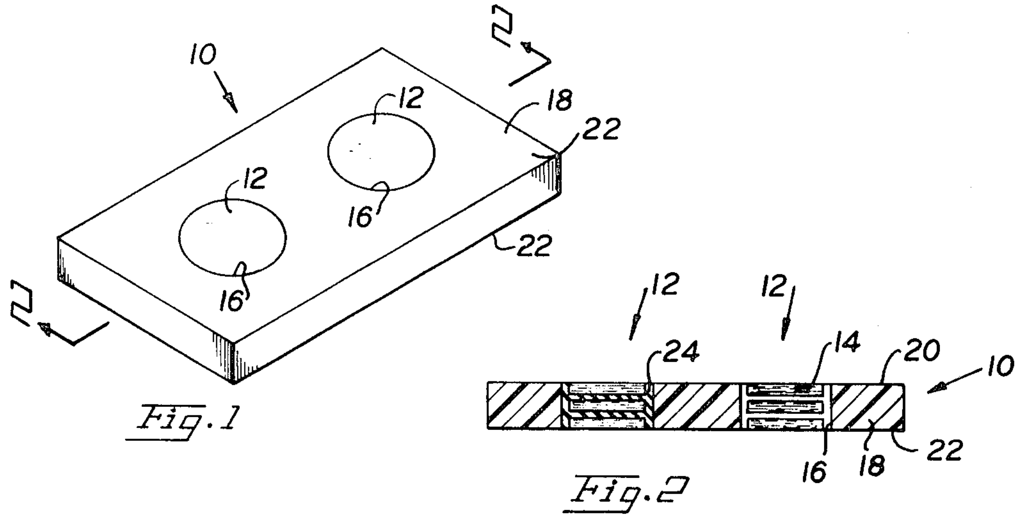
FIG. 1 is a perspective view of a strip of semiconductors fabricated in accordance with this invention.
FIG. 2 is a sectional view of the device of FIG. 1 taken along lines 2—2.

Turning to FIGS. 1 and 2, the multiple semiconductor construction 10 comprises a plurality of crystalline layer assemblies 12, each formed from a stack of passivated silicon chips or other semiconductive wafers 14 set within a hole 16 of a plastic body 18. The body 18 may also be of other suitable nonconductive material; however, it should be provided with parallel opposed obverse and reverse faces 20 and 22 respectively.

The varnish surrounds the edges of the chips 14 and retains them within the hole 16. The varnish being nonconductive prevents leakage of the current past adjacent chips. The chips 14 are, however, set in place so that they are aligned in face-to-face contact with each other, thus permitting electrical current to pass between them and multiplying itself in direct proportion to the number of wafers employed. Each assembly 12 comprises a plurality of chips yet becomes a single independent semiconductor device by which current passing from end to the other is multiplied or increased by predetermined degrees.

Preferably, the varnish used is chosen in accordance with the types described in applications Ser. Nos. 699,100 and 699,205 of which this application is a continuation. Such varnishes may be conventional epoxy resins or similar nonconductive "buttering" agents having the desirable characteristic of softening metals to just that degree to which they may adhere to each other as well as to other nonconductive materials, such as thermoplastics, without changing the overall dimension of the metal or its electrical characteristics. Thus, the varnish 24 serves the dual function of assuring face-to-face contact between adjacent aligned chips as well as retaining the entire stack of chips within the hole 16. The varnish resin agent can thus be called a nonconductor bonding material for surrounding the chips, or a conductive bonding material to adhere chips in face-to-face contact.

The chips 14 are set within the hole 16 so that its upper and lower layers are substantially coplanar with the respective surfaces of the body in that they may be slightly lower or slightly higher than the plane of the body. They are retained within the hole by the use of a varnish compound 24 or other semiliquid inert and nonconductive material. The varnish is, in normal condition, sufficiently solid to permit the packing of the chips in the hole and to allow the construction to be physically handled without their dislocation.

At this early stage, it will be observed that there has been provided a simple and easy method for constructing a plurality of integral cohesive semiconductor units which are structurally rugged and easy to use. The contact faces of each unit permits solder or fuse contact to be made without fear of damage to the unit since a large flat face lying within the plane of the protective body is presented.

The construction may be thus stored, transported and employed without any additional fabrication. Of course, individual units may be cut from the plastic body in the event one or only a few of the units need be employed. Connection may be made directly in any conventional manner as by soldering to the exposed silicon chip located on the obverse and reverse faces. Additionally, it is clear that the arrangement of the holes 16 and consequently the location of the semiconductor assemblies can be predetermined to fit any design function and requirement. The size and form of the plastic body may also be varied.

No discussion need be made here of the specific arrangement of the crystal chips and conductive layers within the hole or relative to each other since such factors are well known in the art. By use of these known methods, the chips may be selected and arranged to give any electrical characteristic, voltage capacity, current load and direction of current flow desired.

Figures 3, 4:
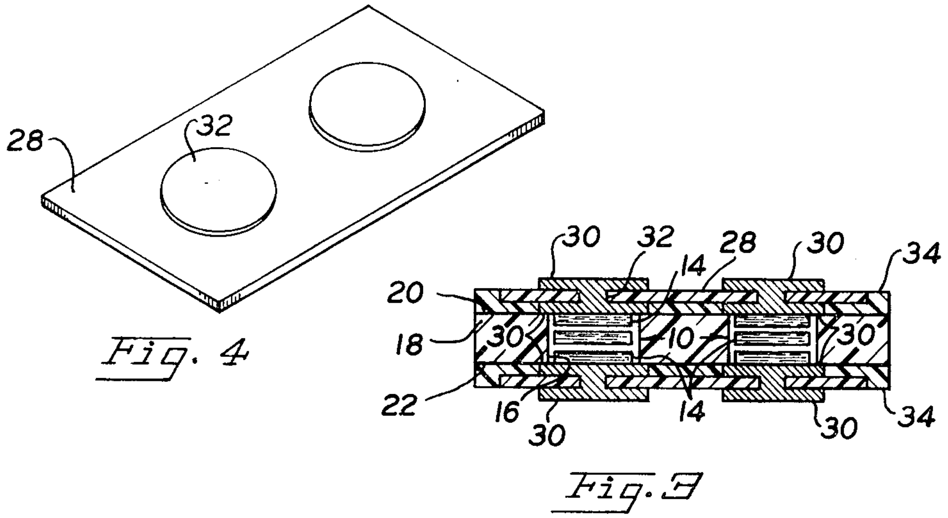
FIG. 3 is a view similar to FIG. 2 showing the encapsulation of the device.
FIG. 4 is a perspective view of the cover shown in FIG. 3.

It may often be preferred to encapsulate the semiconductor into a monolithic housing and provide it with terminals or to employ the device in larger components in which standard metallic terminal connections are desired. Such constructions are illustrated in FIGS. 3 and 4. The semiconductor assembly 10 as seen in FIG. 3 is formed as described hereinbefore but is covered on both of its faces with a plastic substrate 28 which is provided on both of its faces with a plurality of filmlike deposits of metallic material 30. FIG. 4 shows the obverse face of the substrate 28 which like the reverse face is illustrative of the form. The substrate has substantially smooth parallel faces and is provided with one or more holes 32 communicating between its faces so as to provide a passage for the flow of conductive material therebetween. During deposition of the film 30, the hole 32 is also filled, consequently connecting metallic deposits the obverse with those on the chips 14.

The metallic films 30 are preferably silver but may be copper or other highly conductive material. They are deposited on the surfaces of the substrate by any known method as by silk-screening and should preferably be as thin as possible with the physical and electrical ranges required. The film deposits 30 are spaced, oriented and located by any known or suitable means to correspond to the position of semiconductor assemblies 12 and the substrates are placed over the body 18 so that the reverse face films 30 abut against the exposed chips 14 and a buttering agent or a conductive epoxy resin is used to bond the two together. Light pressure may be applied to the entire assembly and it is allowed to cure and harden. Finally, the entire unit, except for the exposed metallic film 30 on the obverse surface of the substrate which becomes the terminal of the assembly, is encased in any epoxy plastic or thermoplastic material 34.

The aforementioned copending applications describe substrate production and registration of abutting members and other steps used in the construction shown in FIGS. 3 and 4. Reference is directed to those disclosures.

At this stage, it will be appreciated that there have been disclosed unit semiconductors, encapsulated and provided with terminals for any design application which are easily fabricated. While silver or other precious metals are used for the terminals, it will be carefully noted that the terminals are waferlike unitary masses. Since they are not thin wire leads, they are less susceptible to destruction than the prior art devices and infinitely less expensive.

It has been noted that the present construction of a semiconductor has wide application. Certainly, individual units may be employed exactly as the prior art devices were. However, the present invention lends itself to unique applications where leadless units are preferred and where multiple ganged or predetermined orientation is required. One such application is illustrated here in connection with FIGS. 5 to 9 wherein a voltage amplifier, such as that of copending Ser. No. 699,100, is shown. In this illustration, the advantages of using less expensive elements, integrating fabrication of semiconductor and amplifier and of producing more efficient and reliable components will be appreciated.

Figure 5:
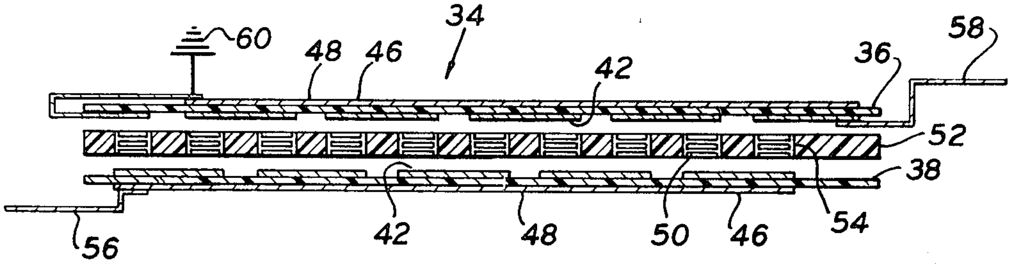
FIG. 5 is a sectional view of a novel voltage amplifier using the novel construction of semiconductors.

Referring to FIG. 5, there will be seen a 10-stage voltage amplifier unit comprising a sandwich assembly 34 having a pair of dielectric substrates 36 and 38 arranged in face-to-face relationship. The substrates are preferably formed from thermoplastic material or other nonconductive substances which are capable of having thin coatings of metal film adhered to it. The substrates are shown as rectangular (this is for convenience only and they may be in any other form, provided that they have parallel planar opposed surfaces).

Figures 6, 7:
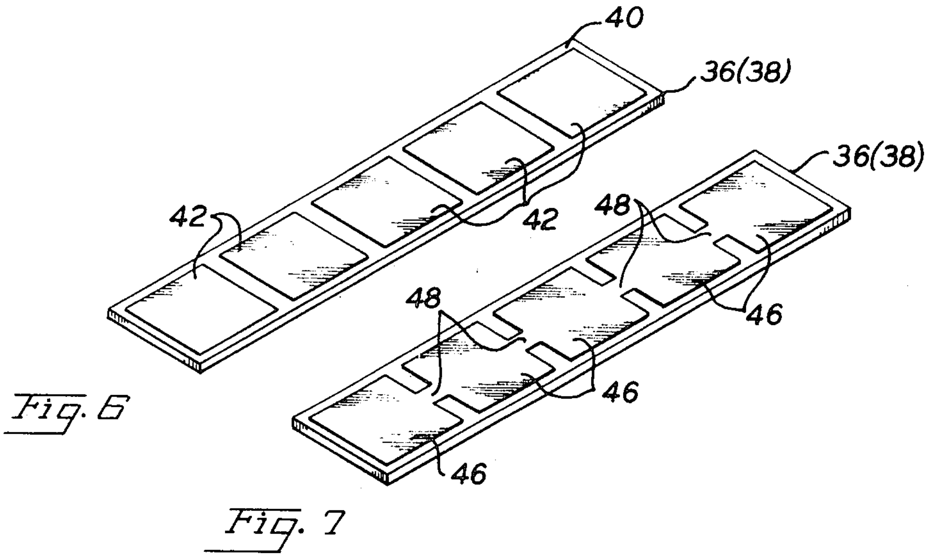
FIGS 6 and 7 are views of the opposite sides of the condenser and capacitor assembly employed in the device of FIG. 5.

As seen in greater detail in FIGS. 6 and 7 wherein the obverse and reverse faces of a single substrate is shown, the substrates have adhered to their obverse face 40 five spaced and relatively oriented metallic wafers 42 and to their reverse face 44 a corresponding number of similarly shaped and spaced metallic wafers 46 which are joined by interconnecting strips 48. Consequently, there is formed on each substrate a progressive series of five spaced capacitor units (FIG. 5) each of which has its reverse electrodes, namely, wafer 46 commonly connected.

The wafers 42 and 46 and the strips 48 are preferably silver, copper or other highly conductive materials deposited as a thin film on the substrates by conventional silk-screening processes. The wafer may be painted on the substrate or it may be provided as a foil which is pasted or glued to the substrate.

Figure 8:
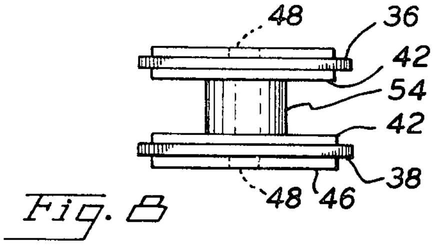
FIG. 8 is an end view of the device shown in FIG. 5.

The substrates are placed with their obverse faces opposed to each other and laterally offset so that each capacitor bridges two of the capacitors on the facing substrate. A series of alternately directed diodes 50 mounted within a plastic strip 52 is located therebetween. The diodes 50 are semiconductors fabricated as disclosed in connection with FIGS. 1 and 2 and comprise a plurality of stacked fused silicon chips 54 embedded in a varnish carrier. The diodes are serially connected to the obverse electrode wafers 42 to effect cascading voltage multiplication as broadly disclosed in Ser. No. 699,100. Input and output leads 56 and 58 respectively are connected to the first and last of the semiconductors 50 and a ground connection 60 to the reverse electrode wafers 46 is set into place. Proper connection between semiconductors and the electrode wafers, the input and output leads with the diodes and the ground connection with the electrode wafers is insured by spreading a thin layer of epoxy resin or similar buttering agent between the contiguous parts. The resin or buttering agent acts to soften the metallic parts so that the thin metal films tend to flow somewhat under pressure. The assembly is then placed under light pressure so that all the various parts mate securely and is aged or cured to firmly fuse the mating parts as seen in FIG. 8. Finally, the whole is encapsulated within an insulating plastic covering to form a unitary body.

Figure 9:
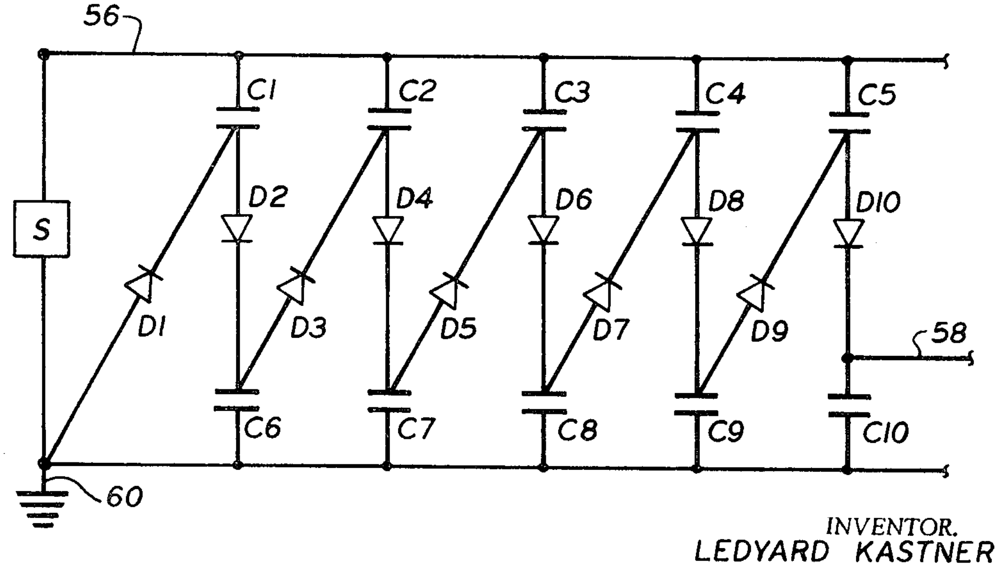
FIG. 9 is a schematic diagram of the electrical circuit of the device of FIG. 5.

The electronic characteristics of the amplifier is shown in the schematic drawing of FIG. 9. The capacitor units formed about the upper substrate are denoted $C_1$–$C_5$, while the units formed about the lower substrate are denoted $C_6$–$C_{10}$. The semiconductors 50 are shown as diodes $D_1$–$D_{10}$. The input and output leads and the common ground connection retain the numerals used previously. It will be appreciated that at the output lead, the AC input is multiplied five fold as a consequence of the series parallel relationship of the condensers and diodes, which during each half AC cycle act to progressively charge one-half of combined condenser and during the second half-cycle to build on the first charge to create a capacitance equal to the position of the output lead. Consequently, if the AC source was at 100 volts, the output at diode $D_{10}$ would be substantially above 500 volts.

It will be appreciated that the output lead could be placed at any position, i.e., any diode could be tapped, and a corresponding voltage multiplication could be obtained. Furthermore, the number of capacitor stages may be chosen as desired. That is, the present device may be easily built to provide output voltages between 5–75 kv.

It will be apparent that many of the details of the voltage amplifier and its fabrication are similar to those described in Ser. No. 699,100. The aforesaid application is referred to for its additional details, as if more fully set forth of the substrate construction, the deposition of the wafers and the fusing of the metal leads, silicon chips, etc. Furthermore, the overall arrangement of the condenser units and diodes into a voltage amplifier find antecedent in the earlier description.

From the foregoing description, it will be observed that a voltage amplifier is constructed having only three leads, input, ground and output. None of the internal elements employed have any leads. Thus, fabrication time, soldering and precision handling are reduced almost to a minimum. It will be further observed that commercial semiconductor units are not used and that the fabrication of semiconductors with the voltage amplifier is fully integrated, consequently also reducing total assembly time considerably. It is estimated that reduction of time averaging over 40 percent can be made by the use of the inventive concepts herein disclosed. Further, numerous tools presently employed to fabricate the semiconductors or to assemble voltage amplifier, such as "jigs," "boats," "soldering irons," etc., are no longer required. In addition, the construction of a unitary encapsulated integrated electronic component insures greater reliability, efficiency and life.

Having thus described the inventive features in illustrative form, it will be appreciated that various applications, changes and modifications may be made without departing from the spirit of the invention. It is maintained that the scope of the invention should not be limited by the illustration but only by the following claims.

What is claimed is:

1. A semiconductor comprising
   a nonconductive body having opposed parallel surfaces,
   a hole located within said body extending from one surface to the other,
   a predetermined layered assembly of crystalline chips adhered in face-to-face contact by a nonconductive bonding material located within said hole,
   the upper and lower layers of said assembly being substantially coplanar with each of the respective surfaces,
   and said bonding carrier securing said assembly within said hole.

2. A semiconductor according to claim 1 wherein the crystalline chips are silicon.

3. A semiconductor according to claim 1 including
   a nonconductive cover member overlying each surface of said body,
   said cover having a film of conductive material exposed on each of its faces in position corresponding to the position of the upper and lower layers,
   and means for chemically fusing the conductive film on one face of each of said covers to the respective outer layer of said crystalline assembly.

4. The semiconductor according to claim 3 including means for encasing said unit into a monolithic structure.

5. An arrangement of semiconductors comprising
   a nonconductive body having opposed parallel surfaces,
   a plurality of holes located within said body in predetermined selected position extending from one surface to the other,
   a predetermined layered assembly of crystalline wafers adhered in face-to-face contact by a nonconductive bonding material located within each of said holes,
   the upper and lower layers of each of said assemblies being substantially coplanar with each of the respective surfaces of said body,
   said bonding material carrier securing each of said assemblies within each hole,
   a nonconductive cover member overlying each of said surfaces,
   said cover member having a plurality of metallic elements positioned to correspond to the respective positions of said layered assembly,
   and means abutting each cover against the respective surface of said body in alignment so that the metallic element is electrically connected to its corresponding layered assembly through the outer layer.

6. A voltage multiplier for amplifying the voltage of an AC source employing a plurality of parallel circuits connected to said source, each circuit comprising
   a series connected rectifier and a condenser whereby said voltage is amplified as a multiple of the number of circuits employed,
   said condensers being alternatively located in a pair of condenser assemblies,
   each assembly comprising a pair of dielectric members having opposed parallel faces,
   a series of uniformly spaced capacitor elements provided on each face thereof,
   said dielectric members being arranged in stacked spaced relationship to form a series of transversely aligned capacitor sets and said rectifier comprises a plurality of layered semiconductor assemblies mounted within a nonconductive body having opposed parallel faces,
   each of said assemblies comprising a plurality of semiconductors arranged in face-to-face contact within a hole extending from one face of said body to the other face thereof with the upper and lower layers substantially coplanar with the respective surfaces, the holes being arranged in corresponding pattern with said transversely aligned capacitor sets,
   and means for electrically connecting each of said capacitor elements to the respective layer of said semiconductor.

7. The voltage multiplier according to claim 6 wherein said condenser and rectifier are encapsulated in a monolithic unitary housing.

8. The voltage amplifier according to claim 6 wherein said capacitor elements are deposited in waferlike films of conductive material and are chemically fused to said respective layers of the semiconductor.

9. The voltage multiplier according to claim 6 wherein said rectifiers comprise a predetermined layered assembly of crystalline chips and conductive bonding material secured within the hole by a semiliquid nonconductive material.

10. The voltage multiplier according to claim 9 wherein said crystalline chips are silicon.

* * * * *